(12) United States Patent
Ueda

(10) Patent No.: US 6,559,486 B2
(45) Date of Patent: May 6, 2003

(54) ETCHING MASK, PROCESS FOR FORMING CONTACT HOLES USING SAME, AND SEMICONDUCTOR DEVICE MADE BY THE PROCESS

(75) Inventor: Yasuhiko Ueda, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/725,873

(22) Filed: Nov. 30, 2000

(65) Prior Publication Data

US 2001/0002731 A1 Jun. 7, 2001

(30) Foreign Application Priority Data

Dec. 1, 1999 (JP) .......................................... 11-342031

(51) Int. Cl.[7] ............................................. H01L 29/74
(52) U.S. Cl. ........................ 257/217; 257/77; 257/355; 257/372; 257/373; 257/375; 257/376
(58) Field of Search ................................ 257/217, 372, 257/373, 375, 376, 355, 77

(56) References Cited

U.S. PATENT DOCUMENTS

| | | | |
|---|---|---|---|
| 5,235,195 A | * 8/1993 | Tran et al. ..................... | 257/59 |
| 5,565,384 A | * 10/1996 | Havemann ................... | 437/228 |
| 5,956,594 A | * 9/1999 | Yang et al. .................. | 438/396 |
| 6,022,776 A | * 2/2000 | Lien et al. ................... | 438/253 |
| 6,103,590 A | * 8/2000 | Swanson et al. ............ | 438/409 |
| 6,218,299 B1 | * 4/2001 | Akahori et al. ............. | 438/682 |
| 6,346,475 B1 | * 2/2002 | Suzuki et al. ............... | 438/637 |
| 6,211,561 B1 | * 4/2002 | Zhao ........................... | 257/522 |

FOREIGN PATENT DOCUMENTS

| | | | |
|---|---|---|---|
| EP | 725 440 | * | 8/1996 |
| EP | 0 725 440 | * | 8/1996 |
| EP | 922 944 | * | 6/1999 |
| JP | 6-349789 | | 12/1994 |
| JP | 9-55429 | | 2/1997 |
| JP | 10-189736 | | 7/1998 |
| JP | 10-289952 | | 10/1998 |
| JP | 11-31678 | | 2/1999 |
| JP | 11 40870 | * | 2/1999 |
| WO | WO 92/21217 | | 4/1999 |

* cited by examiner

Primary Examiner—Nathan J. Flynn
Assistant Examiner—Ahmed N. Sefer
(74) Attorney, Agent, or Firm—McGinn & Gibb, PLLC

(57) ABSTRACT

An etching mask having high etching selectivity for an inorganic interlayer film of $SiO_2$ or $Si_3N_4$, an organic interlayer film such as ARC and an electrically conductive film and a contact hole using such an etching mask, a process for forming same and a resultant semiconductor device. On formation of contact holes for connecting wirings disposed through interlayer films of inorganic or organic material (20, 23 in FIG. 2), a thin film of silicon carbide (21 in FIG. 2) having high etching selectivity for any of the inorganic and organic materials is deposited on an interlayer film, and a mask pattern of silicon carbide is formed using a resist pattern (22 in FIG. 2). Thereafter, high aspect ratio contact holes having a size which is exactly same as that of the mask is formed by etching the interlayer film using the silicon carbide mask.

2 Claims, 15 Drawing Sheets

- 22; RESIST
- 21; SILICON CARBIDE
- 20; INORGANIC INTERLAYER FILM

- 22; RESIST
- 21; SILICON CARBIDE
- 23; ORGANIC INTERLAYER FILM
- 20; INORGANIC INTERLAYER FILM

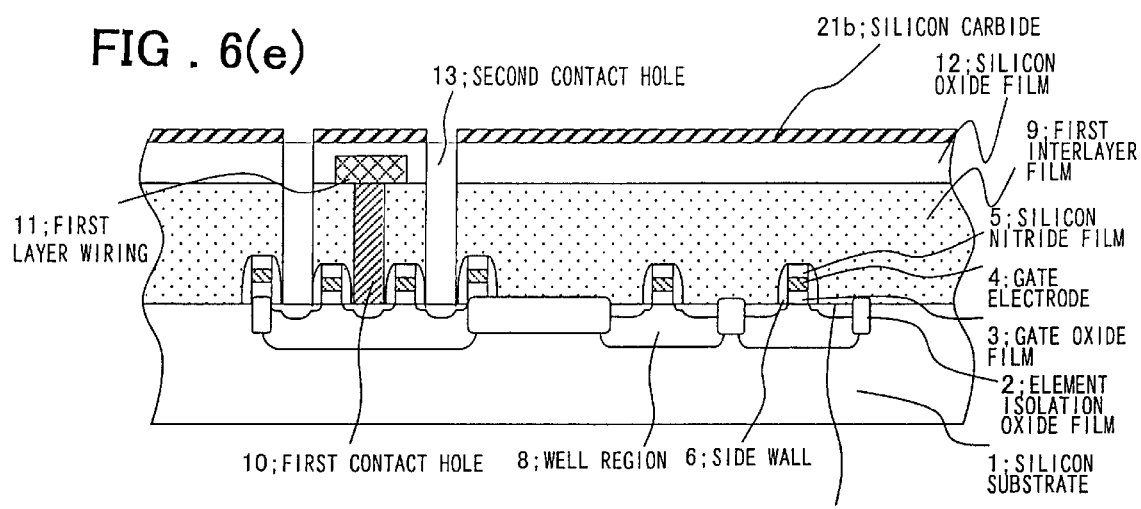
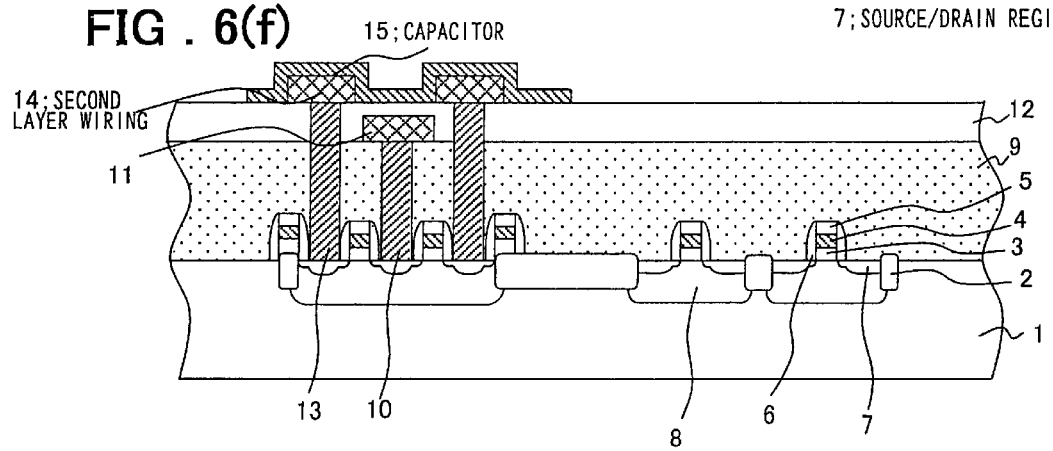
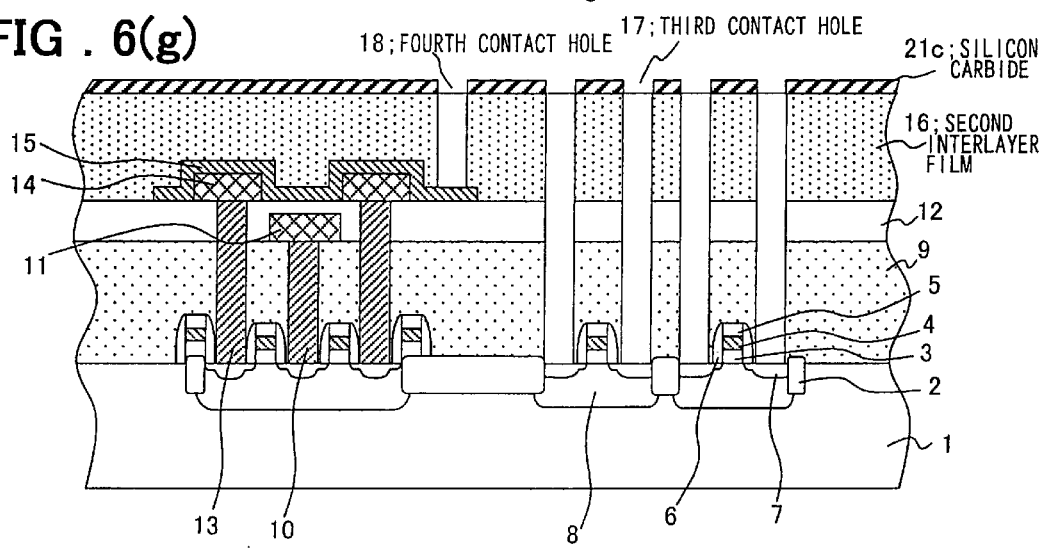

ENLARGEMENT OF OPENING DIAMETER

ETCHING MASK, PROCESS FOR FORMING CONTACT HOLES USING SAME, AND SEMICONDUCTOR DEVICE MADE BY THE PROCESS

FIELD OF THE INVENTION

The present invention relates to an etching mask, a process for forming contact holes using the same etching mask, and a semiconductor device which is manufactured by the same process.

BACKGROUND OF THE INVENTION

With an recent advance in high integration density and smaller size of semiconductor devices, the area of each element has been remarkably reduced. However, the thickness of the films therefor should be increased if the same materials are used since it is necessary to provide an electric resistance which is equal to or less than that of the conventional semiconductor devices. Thus, the thickness of the interlayer films will increase, so that a case where contact holes in the second and subsequent films require a depth which is 3 μm or more is not rare. Since the diameter of the contact holes has become smaller and smaller, the technique to fabricate contact holes having a higher aspect ratio at a high precision has been demanded.

A process for forming contact holes in the course of manufacturing conventional general DRAM (Dynamic Random Access Memory) process will now be described with reference to the drawings. FIGS. 10 through 12 are sectional views schematically showing a conventional process for manufacturing a DRAM. For convenience of drawing, these drawings are separated with an alphabetical sequence.

After an element isolation oxide film 2 is formed in a given region of a silicon substrate 1 by a trench isolation method as shown in FIG. 10(a), memory regions and peripheral circuit regions are formed. Well-regions 8 are formed by implanting ions of phosphorous, boron, etc. into respective regions. A gate oxide film 3, gate electrode film 4 and silicon nitride film 5 are successively deposited on the silicon substrate 1, and gate electrodes are formed by etching process, source/drain regions 7 are formed by the implantation of ions of phosphorus and the like.

Subsequently, after a silicon oxide film is deposited to cover the gate electrodes as shown in FIG. 10(b), side walls 6 are formed by applying an anisotropic etching and $n^+/p^+$ layers are formed by protecting given regions with a resist and implanting ions of phosphorus and boron, etc.

Then, a first interlayer film 9 is deposited over an entire surface of the silicon substrate 1 as shown in FIG. 10(c) and a resist pattern 22 is formed in such a manner that regions to be connected to bit lines are exposed. Contact holes are formed in the first interlayer film 9 by plasma etching using the resist pattern 22 as an etching mask and using a carbon fluoride (CF system) gas.

In order to enhance the precision of the size of openings of the resist pattern 22 by eliminating the influence of the reactivity with the underlying layer (or substrate) and the reflected light from the underlying layer (or substrate) on formation of the resist pattern 22, an antireflection coating (hereinafter referred to as ARC) 28 may be formed between the first interlayer film 9 and the resist 22. In this case, hole is first formed in the ARC using oxygen gas by plasma etching with the aid of the resist pattern 22 as a mask. Thereafter, the first interlayer film 9 is formed leaving a contact hole 10 by the plasma etching using CF gas. The ARC 28 will be removed together with the resist pattern 22 after formation of the first contact hole 10.

Then, a bit line (first film wiring 11) which is to be connected to polysilicon is formed after polysilicon (and the like) is buried in the first contact hole 10 as shown in FIG. 10(d).

Subsequently, after a silicon oxide film 12 is deposited over an entire surface of the silicon substrate 1 and the resist pattern 22 is formed so that a region which is to be connected to storage nodes will be exposed as shown in FIG. 11(e), (second) contact holes which extends through the silicon oxide film 9 are formed by a plasma etching using the resist pattern 22 as an etching mask and using an CF gas. An ARC 28 may also be formed on the silicon oxide film 12 in order to prevent the influence of underlying substrate in the course of the resist pattern forming process. In this case, the ARC is firstly subjected to boring (hole-opening) by the plasma etching with oxygen gas. Thereafter, the (second) contact holes are formed in the silicon oxide film 12 and the first interlayer film 9 by using CF gas.

After polysilicon, etc is buried in second contact holes 13 as shown in FIG. 11(f), a metal film (second layer wiring 14) which will be connected to polysilicon is formed, and a high dielectric thin film and a metal film are subsequently formed thereon, so that a capacitor 15 comprising a dielectric thin film which is sandwiched between the metal films is formed.

Subsequently, a second interlayer film 16 is deposited over the entire surface of the silicon substrate 11 and a resist pattern 22 is formed in such a manner that regions which are connected to the source/drain regions 7 and the capacitor 15 are exposed as shown in FIG. 11(g). Third contact holes extending through the second interlayer film 16, silicon oxide film 12 and first interlayer film 9 and a fourth contact hole extending through the second interlayer film 16 are formed by the plasma etching using the resist pattern 22 as an etching mask and using CF gas. In this process, the ARC may also be similarly formed for canceling the influence of an underlying layer (or layers).

Then, after titanium and titanium nitride is buried in a fourth contact hole 18 which is connected with the capacitor 18 and titanium nitride is buried in the third contact holes 17 which are connected to the source/drain regions 7 as shown in FIG. 12(h), titanium silicide is formed in the source/drain regions 7 by conducting heat treatment.

After a third layer wiring 19 is formed by depositing a film of a metal such as Al as shown in FIG. 12(i), a DRAM is formed by depositing an interlayer insulating film and a passivation film (not shown) thereon.

SUMMARY OF THE DISCLOSURE

In the above-mentioned process for manufacturing DRAM, there is a tendency that the contact holes shown in FIGS. 11(e) and 11(g) will have an increased aspect ratio in association with the reduction in the size of the device and the enhanced performance thereof. It is of great importance in the manufacturing of DRAM how the contact holes can be opened at high precision.

The resist patterns have heretofore been used as an etching mask when such contact holes are opened. However, there are problems in that the openings (i.e., hole edges) of the resist will gradually increase, so that the opening diameter of the contact holes will also increase since the resist per se is also etched on dry etching for forming the contact holes and in that the thickness of the resist may be reduced. On the other hand, the thickness of the resist tends to decrease in association with the reduction in the size of the devices. The resist is not endurable against the dry etching for an extended period of time.

The last problem will be explained with reference to FIGS. 13 and 14 in more detail. FIGS. 13 and 14 are sectional views schematically showing a process for forming contact holes by using a conventional resist pattern as an etching mask. In FIG. 14, an antireflection film 28 of an organic material is formed on a silicon oxide film 20 for canceling the activity with the underlying layer(s) and the influence of the underlying layer(s).

In the conventional process for forming contact holes, the resist pattern having a film thickness of about 700 nm has been formed on an inorganic interlayer film 20 such as silicon oxide film having a thickness of 3 $\mu$m as shown in FIG. 13 and the contact holes have been formed by the plasma etching using a fluorocarbon mixture gas (termed herein "CF gas")). Since the film thickness of the resist is gradually reduced and the diameter of the opening becomes gradually larger, the opening diameter of the contact holes (edges) becomes larger than that in the initial resist pattern.

In particular, in a case where the inorganic ARC 28 is formed on the silicon oxide film 20 as shown in FIG. 14, oxygen should be mixed with the etching gas for dry etching for opening holes in the ARC 28. Mixing of oxygen promotes the etching of the resist, so that the diameter of the opening of the contact holes will further increase.

In order to overcome the above mentioned problem, an approach to use polysilicon and the like as an etching mask in lieu of the resist has been considered. If polysilicon is used as a mask, it is possible to provide a higher etching selectivity of the polysilicon than that of the resist for the CF gas. The Si may react with CF gas is high and the vapor pressure of the product of the reaction may become high. Accordingly, polysilicon is not suitable for the material of the etching mask. Since polysilicon is not dielectric, it should be removed after formation of the contact holes. However, it is hard to selectively remove only polysilicon after opening of the contact holes.

A method to use $Si_3N_4$ as an etching mask has also been proposed. This method can be used in a case where the contact holes are formed to extend through a silicon oxide film. However, it is not possible to provide an etching selectivity if the contact holes should be also formed to extend through the silicon nitride film, for example, the silicon nitride film of the gate electrode.

Generally, the present invention has been achieved encountering the above-mentioned problems.

It is an object according to an aspect of the present invention to provide a novel etching mask which is capable of forming contact holes having a high aspect ratio and assures a high etching selectivity for $SiO_2$ and $Si_3N_4$ as well as organic ARC, interlayer film and electrically conductive film.

It is another object according to another aspect of the present invention to provide a novel process for forming contact holes using the same mask.

It is a further object according to a further aspect of the present invention to provide a novel semiconductor device which is formed by the process.

Other objects and aspects of the present invention will become apparent in the entire disclosure.

In a first aspect of the present invention, there is provided an etching mask used for forming contact holes to connect wiring layers which sandwich an interlayer film therebetween, wherein the etching mask comprises or is formed of silicon carbide.

In a second aspect of the present invention, there is provided a process for forming contact holes to connect wiring layers which sandwich an interlayer film therebetween comprising the steps of: forming a thin film of silicon carbide on an interlayer film through which said contact holes will be formed; forming a resist pattern on said silicon carbide film; dry-etching said exposed portions of said silicon carbide film using said resist pattern as a mask; removing said resist pattern by dry or wet-etching; and forming contact holes through said interlayer film using said silicon carbide film as a mask.

In a third aspect of the present invention, there is provided a semiconductor device in which wiring layers on and under an interlayer film are connected to one another through contact holes which are formed to extend through the interlayer film, wherein an insulating film made of silicon carbide is disposed between the interlayer film and the wiring layer disposed thereon.

In a fourth aspect of the present invention, there is provided a semiconductor device comprising: a semiconductor substrate; at least one gate electrode and source/drain regions thereon; and a plurality of interlayer films and a plurality of wiring layers which are stacked on the gate electrode. The gate electrode(s) and said wiring layers being connected to one another through contact holes formed to extend through the interlayer films. The device is characterized in at least one of the contact holes is formed so as to extend through a silicon nitride film which is disposed to cover the gate electrode(s) and one of the interlayer films which is deposited on the gate electrode.

Particularly, the contact holes are formed using a silicon carbide film as an etching mask, resulting in a sharp opening edge of the contact holes to provide a high aspect ratio of the contact holes as well as selective etching capability.

BRIEF DESCRIPTION OF THE DRAWINGS

FIG. 6 is a sectional view schematically showing a process for manufacturing a DRAM in accordance with the first embodiment of the invention.

PREFERRED EMBODIMENTS OF THE INVENTION

Now, modes carrying out the present invention will be described with reference to the drawings.

[Embodying Mode 1]

A process for forming a contact hole in accordance with a first mode of embodying the invention will be described with reference to FIG. 1. FIG. 1 is a sectional view schematically explaining a way of etching in accordance with the first mode of embodying the invention.

The first mode of embodying the invention resides in that contact holes having a high aspect ratio are formed to extend through an inorganic interlayer film comprising a single member (material) of silicon oxide film by using an etching mask made of silicon carbide.

Figure 1A:
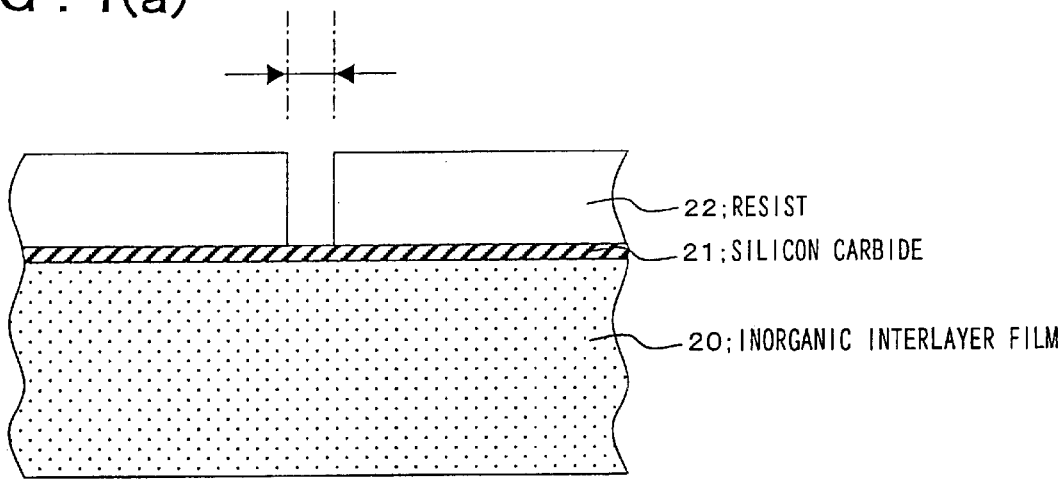
FIG. 1 is a sectional view schematically showing a process for forming contact holes in a first mode of embodying the invention.

Firstly, as shown in FIG. 1(a), a silicon carbide (SiC) film 21 having a thickness of about 200 nm is formed on an inorganic interlayer film 20 of silicon oxide film and the like having a thickness of about 4 μm through which contact holes will be formed by the CVD process using trichlorosilane ($SiHCl_3$) and propane ($C_3H_8$) as a raw material gas (mix). Subsequently, a resist having a thickness of about 500 nm is applied on SiC 21, and a resist pattern 22 including an opening (edge of hole) having a desired diameter is formed by known lithography.

Conventionally, the inorganic interlayer film 20 of silicon oxide and the like was etched by using the resist pattern 22 as an etching mask. Thus it was necessary to preset such a film thickness of the resist pattern 22 so that it was endurable against the etching for an extended period of time. Since etching of the contact holes having a high aspect ratio is conducted using SiC 21 and the resist pattern 22 is used for etching only the SiC 21 in the present mode of embodying the invention, it is not necessary to form a thick resist unlike the prior art.

Figure 1B:
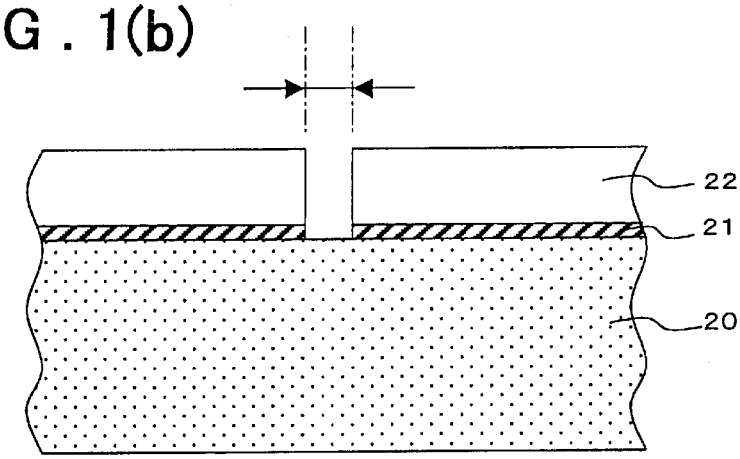

Then, the SiC 21 disposed within the opening of the resist pattern 22 is removed by a plasma etching process using, for example, parallel plate RIE system as shown in FIG. 1(b). Etching was conducted using an $NF_3$/Ar gas as an etching gas at a flow rate of $NF_3$/Ar=30/200 sccm, a pressure of 2.66 Pa (20 mTorr), and a stage temperature of 0° C. Under these conditions, the etching selectivity for the resist of SiC 21 was 3 and the difference between CDs before and after the etching was within ±4 nm.

Figure 1C:
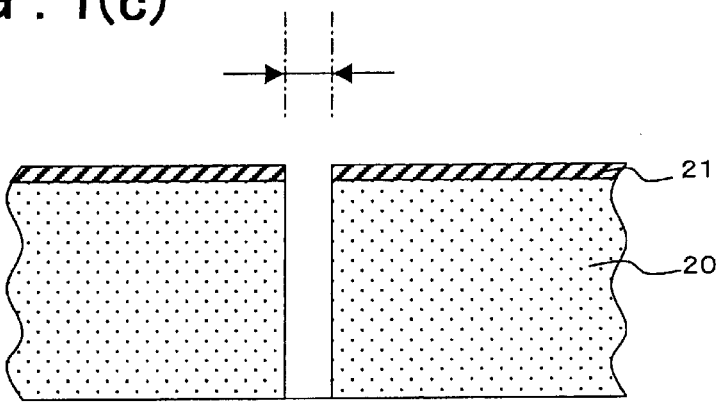

Thereafter, the resist pattern 22 is removed by an ashing treatment using oxygen plasma and wet etching with an acid and alkaline solutions. Then, contact holes were formed by removing the inorganic interlayer film 20 by the plasma etching process using SiC 21 as an etching mask and, for example, parallel plate RIE system as shown in FIG. 1(c). Etching was conducted using $C_4F_8$/CO/Ar/$O_2$ gas as an etching gas at a flow rate of $C_4F_8$/CO/Ar/$O_2$=25/60/300/10 sccm, a pressure of 5.32 Pa (40 m Torr) and a stage temperature 0° C.

Under these conditions, the etching selectivity for SiC 21 of the silicon oxide film was 60, the etching rate of the silicon oxide film was 750 nm/min. An etching performance in which contact holes having a high aspect ratio was achieved. The difference between CDs before and after the etching was within ±5 nm. The SiC 21 which was formed under conditions in the mode of embodying the invention had an enough resistivity (1E 14 Ωcm or more) and can be used as an interlayer film as it is without being separated after the formation of the contact holes. The step for removing the etching mask can be simplified (eliminated) in comparison with the case using the polysilicon as an etching mask, which has been mentioned at the explanation of the prior art.

When the etching mask is removed, etching is conducted at a flow rate of $NF_3$/Ar=500/1000 sccm, a pressure of 39.9 Pa (300 m Torr) and a stage temperature of 0° C. Since the flow rate and the pressure is high in the present process, the etching efficiency of SiC 21 is remarkably enhanced. Etching species hardly reach at the bottom of the deep holes due to high pressure, so that they will not change the profile of the opening of the contact holes which have been formed prior to etching of SiC 21

Since the etching selectivity can be about 60 for SiC of the silicon oxide film in accordance with the method of forming contact holes using SiC 21 as an etching mask in the present embodying mode in such a manner, the diameter of the opening (edge) of the resist pattern will not increase during etching unlike the conventional in which the resist pattern having an etching selectivity of the silicon oxide film of about 8 is used. High aspect ratio contact holes having the exactly same specified size can be formed, so that demand for reduction in size of devices can be fulfilled.

[Embodying Mode 2]

Now, a process for forming contact holes in a second mode of embodying the invention will be described with reference to FIG. 2. FIG. 2 is a sectional view schematically explaining the manner of etching which is carried out in the second mode.

In the second mode of embodying the invention, contact holes having a high aspect ratio are formed in a structure including a stack of an inorganic interlayer film of silicon oxide and an organic interlayer film of BCB (benzocyclobutene). Note, however, the organic interlayer film may be at least one selected from BCB, polyimide, SiLK (trade name of Dow Chemical) and FLARF (trade of Honeywell Electronic Materials) or any other suitable organic insulating film.

Figure 2A:
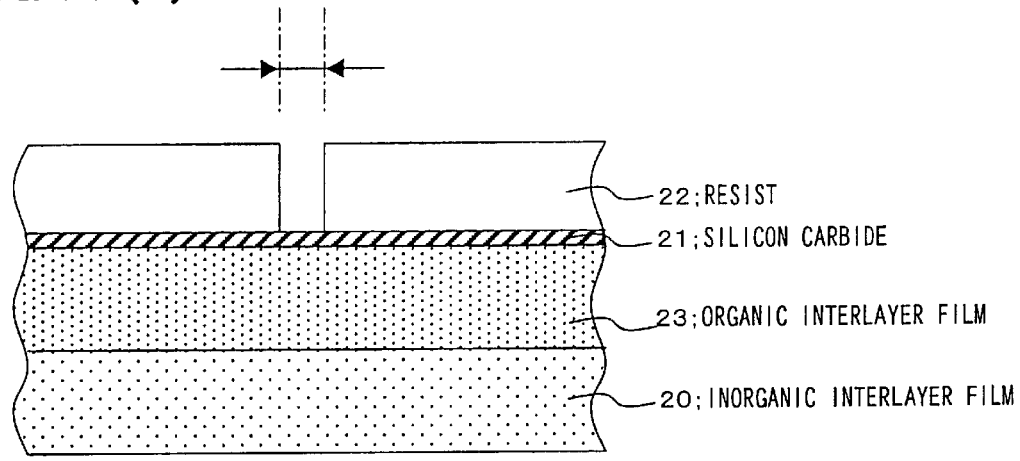
FIG. 2 is a sectional view schematically showing a process for forming contact holes in a second mode of embodying the invention.
Figure 2B:
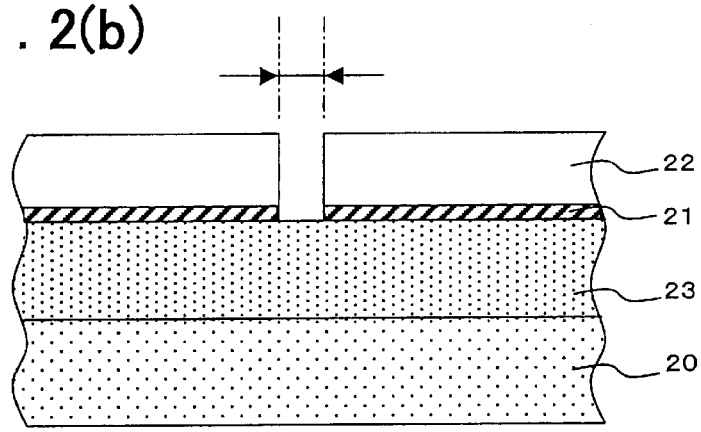
Figure 2C:
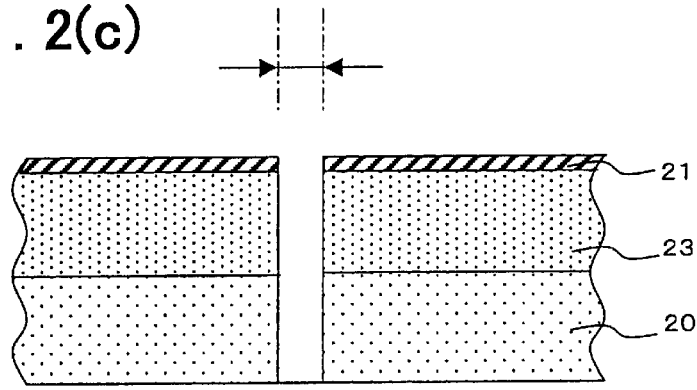

Firstly, as shown in FIG. 2(a), a SiC film 21 having a thickness of about 200 nm is formed on a stacked laminate of an inorganic interlayer (lower layer) film 20 made of a silicon oxide film of about 200 nm and an organic interlayer (upper layer) film 23 made of BCB of about 750 nm layered in this order. The SiC film is formed by a CVD process using, for example, trichlorosilane and propane as a raw material gas (mix) similarly to the above-mentioned first embodying mode. Subsequently, a resist is applied at a thickness of about 500 nm and a resist pattern 22 having a desired opening diameter is formed by known lithography. Then, as shown in FIG. 2(b), a portion of SiC 21 exposed within the opening of the resist pattern 22 is removed by plasma etching process using, for example, a parallel plate RIE system.

Thereafter, the resist pattern 22 is removed by ashing treatment (burning or thermal decomposition) using oxygen plasma and wet etching using acid and alkaline solutions to leave a patterned opening. Subsequently, as shown in FIG.

2(c), a portion of the silicon oxide film 20 and BCB 23 exposed within the opening of the resist pattern 22 is removed by plasma etching process using the SiC film 21 as an etching mask and using, for example, a parallel plate RIE system, for forming contact holes. Etching was conducted by using a $Cl/O_2$ gas mix as an etching gas at a flow rate of $Cl/O_2$=150/150 sccm, a pressure of 3.99 Pa (30 mTorr) and a stage temperature of 20° C. for BCB 23 and by using a $C_4F_8/CO/Ar/O_2$ gas mix as an etching gas at a flow rate of $C_4F_8/CO/Ar/O_2$=25/60/300/10 sccm, a pressure of 5.32 Pa (40 mTorr) and a stage temperature of 0° C. for the silicon oxide film 20.

Under these conditions, the etching selectivity was 60 and the etching rate was 750 nm/min, respectively, of the silicon oxide film 20 relative to the SiC film 21, and the etching selectivity was 40 and the etching rate was 450 nm/min, respectively, of BCB 23 relative to the SiC film 21. An etching performance which is capable of forming contact holes having a high aspect ratio could be obtained. The SiC film 21 which was formed under conditions of the present embodying mode had enough resistivity and can be used after the formation of the contact hole without separation (removal) similarly to the above-mentioned first embodying mode, so that it could be used as an interlayer film as it is.

Although it was difficult to form contact holes by using the resist pattern 22 which is made of an organic material as an etching mask for the organic interlayer film 23 of BCB and the like which is similarly made of the inorganic material in the prior art, the process for forming contact holes using SiC 21 as an etching mask in the present embodying mode makes it possible to provide a high etching selectivity for both the inorganic interlayer film 20 of silicon oxide etc. and organic interlayer film 23 of BCB and the like. Therefore, contact holes which extend through both the inorganic interlayer film 20 and organic interlayer film 23 (vice versa) can be formed by using only SiC 21 as a mask.

[Embodying Mode 3]

Now, a process for forming contact holes in a third mode of embodying the present invent ion will be described with reference to FIG. 3. FIG. 3 is a sectional view schematically explaining the manner of etching in the third embodying mode.

In the third mode of embodying the invention, contact holes are formed, by using only an etching mask of SiC, in a structure in which a gate electrode is covered with a silicon nitride film like a case where contact holes are formed in a peripheral circuit unit provided that self-alignment contacts (SAC) are used in a cell unit of DRAM etc.

Figure 3A:
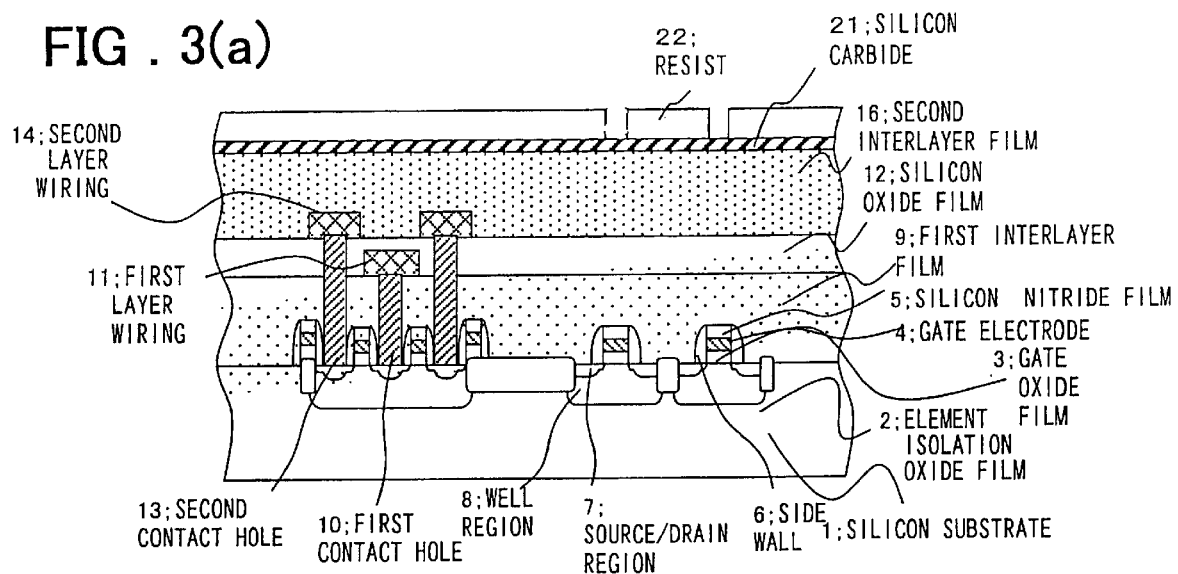
FIG. 3 is a sectional view schematically showing a process for forming contact holes in a third mode of embodying the invention.

Firstly, a gate oxide film 3, gate electrode 4 and silicon nitride film 5 are deposited on the silicon substrate in this order by using a known process as shown in FIG. 3(a), and they are fabricated into a given configuration of a gate structure. Thereafter, side walls 6 made of silicon nitride film are formed. A first contact hole 10 is formed in a first interlayer film 9 made of silicon oxide film which is deposited on the side walls 6 and the gate structures. After polysilicon is buried in the first contact hole 10, a first wiring layer 11 is formed connecting with the first contact hole 10.

Figure 3B:
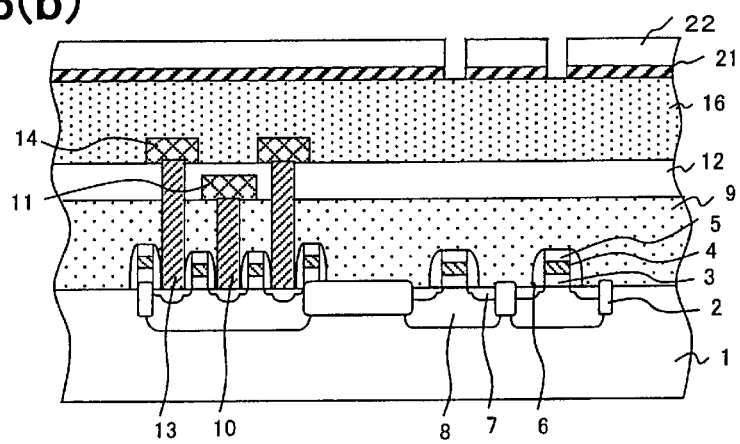

Subsequently, a silicon oxide film 12 is deposited and second contact holes 13 and second wiring layer 14 (connecting with the second contact holes 13) are similarly formed. After a second interlayer film 16 made of silicon oxide film is deposited as an upper layer thereof, SiC 21 having a thickness of about 200 nm is formed similarly to the above-mentioned first embodying mode. Subsequently, a resist pattern 22 having a thickness of about 500 nm is formed, and then a portion of SiC 21 disposed in the opening of the resist pattern 22 is removed by plasma etching process using, for example, parallel flat plates RIE as shown in FIG. 3(b).

Figure 3C:
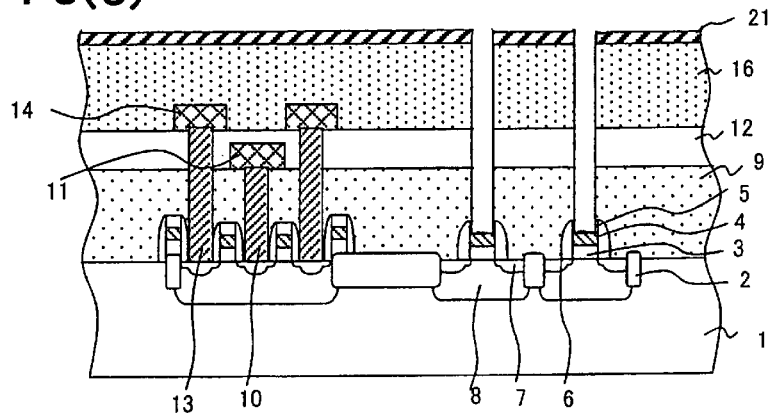

After removal of the resist pattern 22, the second interlayer film 16, silicon oxide film 12, first interlayer film 9 and a silicon nitride film 5 of a gate electrode unit are removed by plasma etching using, for example, a parallel plate RIE system for forming contact holes as shown in FIG. 3(c). Etching was conducted by using a $C_4F_8/CO/Ar/O_2$ gas mix as an etching gas at a flow rate of $C_4F_8/CO/Ar/O_2$=25/60/300/10 sccm, a pressure of 5.32 Pa (40 mTorr) and a stage temperature of 0° C. for silicon oxide films 16, 12, 9, and by using a $C_4F_8/CO/Ar/O_2/CH_2F_2$ gas mix as an etching gas at a flow rate of $C_4F_8/CO/Ar/O_2/CH_2F_2$=15/80/500/10/15 sccm, a pressure of 5.32 Pa (40 mtorr) for the silicon nitride film 5.

Under these conditions, the etching selectivity was 60 and the etching rate was 750 nm/min, respectively, relative to SiC 21 of the silicon oxide films 16, 12, 9, and the etching selectivity was 45 and the etching rate was 500 nm/min, respectively, relative to SiC 21 of the silicon nitride film 5. High aspect ratio contact holes can be obtained by using only SiC as an etching mask and by changing only etching conditions. SiC which was formed under conditions of the present embodying mode can be used as an interlayer film as it is without removal after the formation of the contact holes similarly to the above-mentioned first embodying mode.

In such a manner, the process for forming the contact holes using SiC 21 as an etching mask in the present embodying mode makes it possible to increase the etching selectivity for both silicon oxide films 16, 12 and 9 and the silicon nitride film 5. Thereafter, the contact holes can be formed in a stack (laminate) of the silicon oxide films 16, 12, 9 and the silicon nitride film 5. The present process is also applicable for the self-alignment contact forming process.

[Embodying Mode 4]

Now, a process for forming a contact hole in the fourth mode of embodying the invention will be described with reference to FIG. 4. FIG. 4 is a sectional view schematically explaining the manner of etching in the fourth embodying mode.

In the fourth mode of embodying the invention, a contact hole is formed to extend through a layered structure in which an inorganic interlayer film of a silicon oxide film etc. and an electrically conductive film made of metal, polysilicon etc. are stacked like a multi layered wiring board, by using only an etching mask made of SiC.

Figure 4A:
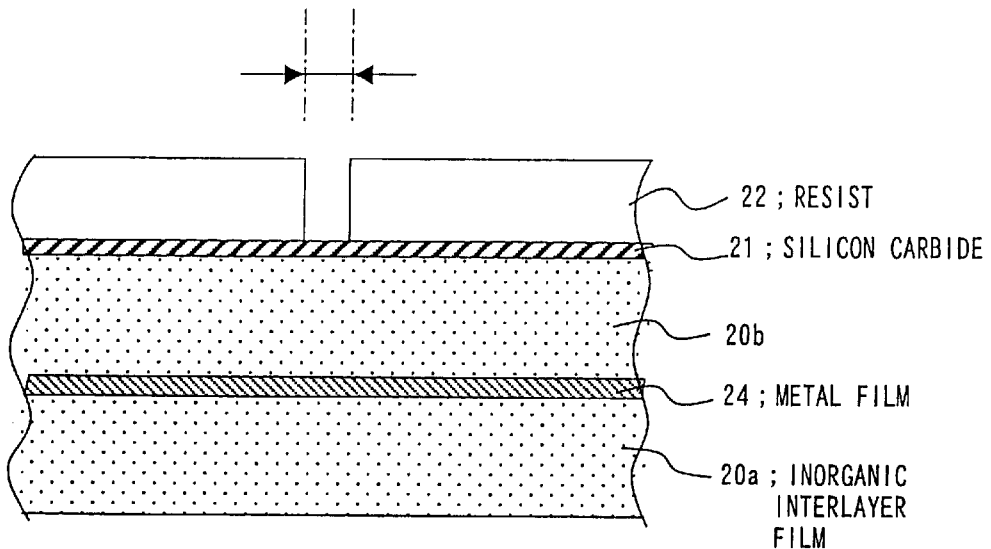
FIG. 4 is a sectional view schematically showing a process for forming contact holes in a fourth mode of embodying the invention.

As shown in FIG. 4(a), SiC 21 having a thickness of about 200 nm is formed on a stack in which an inorganic interlayer film 20a of silicon oxide film having a thickness of about 2 μm, an electrically conductive film 24 of a stack (composite film laminate structure) of TiN (50 nm)/Ti (20 nm)/AlCu (500 nm)/TiN (50 nm)/Ti (20 nm) and a silicon oxide film 20b of about 2 μm are successively deposited similarly to the above-mentioned first mode.

Figure 4B:
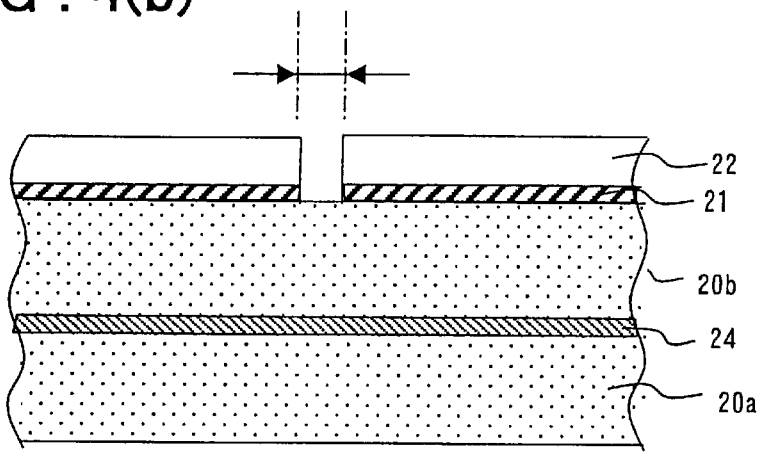
Figure 4C:
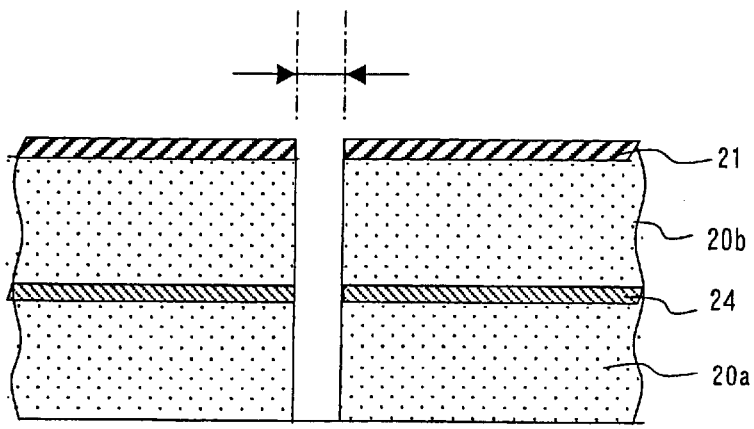

Subsequently, a resist pattern 22 having a thickness of about 500 nm is formed and then a portion of SiC 21 exposed in the opening of the resist pattern 22 is removed by plasma etching process using, for example, a parallel plate RIE system as shown in FIG. 4(b).

After removal of the resist pattern 22, upper silicon oxide film 20b, electrically conductive film 24 and lower silicon oxide film 20a are removed by plasma etching using, for example, a parallel plate RIE system for forming contact holes. Etching was conducted by using $C_4F_8/CO/Ar/O_2$ gas as an etching gas at a flow rate of $C_4F_8/CO/Ar/O_2$=25/60/300/10 sccm, a pressure of 5.32 Pa (40 mTorr) and a stage temperature of 0° C. for the upper and lower silicon oxide films 20a, 20b and by using $Cl_2/BCl_3$ gas as an etching gas at a flow rate of $Cl_2/BCl_3$=80/20 sccm, and a pressure of 1.33 Pa (10 mTorr) for the electrically conductive film 24 of AlCu, etc.

Under these conditions, the etching selectivity was 60 and the etching rate was 750 nm/min, respectively, relative to SiC 21 of the silicon oxide films 20a, 20b, and the etching selectivity was 65 and the etching rate was 850 nm/min, respectively, relative to SiC 21 of AlCu film. Contact holes having a high aspect ratio can be obtained by using only SiC as an etching mask and by changing only etching conditions based on a single masking step. SiC 21 which was formed under the conditions of the present embodying mode has enough resistivity and need not be removed after the formation of the contact holes similarly to the above-mentioned first embodying mode.

In such a manner, it is possible to increase the etching selectivity for both the inorganic interlayer film 20 of silicon oxide film, etc. and the electrically conductive film 24 of AlCu, etc. in accordance with the process for forming contact holes by using SiC alone as an etching mask in the present embodying mode. Therefore, contact holes can be formed to extend through a stack of an insulating and electrically conductive films which constitute a multi-layered wiring substrate. It is not necessary to form contact holes in such a manner that they are shifted for each layer. Reduction in size (particularly, fining of line width) of the multilayered wiring board and simplification of the process can be achieved.

As is apparent from the above-identified four modes of embodying the invention, the etching mask made of silicon carbide of the present invention has a high etching selectivity for any of the inorganic insulating film 20 made of silicon oxide film and silicon nitride, organic insulating film 21 such as BCB, ARC and electrically conductive film 24 of Al, polysilicon, etc. Accordingly, the etching mask can be used for etching a structure in which these various materials are stacked in a desired manner.

For further understanding of the above-mentioned modes of embodying the invention, the embodiments of the present invention will now be described with reference to drawings.

[Embodiment 1]

A DRAM of a first embodiment of the invention and a process for manufacturing the same will be described with reference to FIGS. 5 through 8. FIGS. 5 to 7 are sectional views schematically showing a process for manufacturing the DRAM of the first embodiment of the invention and are separated for convenience of drawing. FIG. 8 is a sectional view showing the structure of DRAM in case where the etching mask is not removed.

Figure 5A:
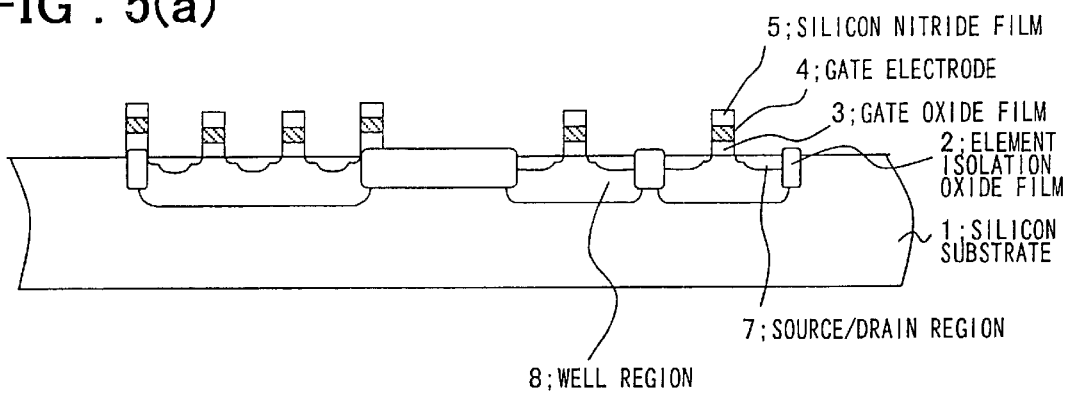
FIG. 5 is a sectional view schematically showing a process for manufacturing a DRAM in accordance with a first embodiment of the invention.

After an element isolation oxide film 2 is formed in given regions of a silicon substrate 1 by a trench isolation method as shown in FIG. 5(a), memory regions and peripheral circuit regions are formed. Well-regions 8 are formed by implanting ions of phosphorous, boron, etc. into respective regions. A gate oxide film 3, gate electrode 4 and silicon nitride film 5 are successively deposited on the silicon substrate 1 and gate electrodes are formed by etching process, followed by forming source/drain regions 7 by the implantation of ions of phosphorus and the like.

Figure 5B:
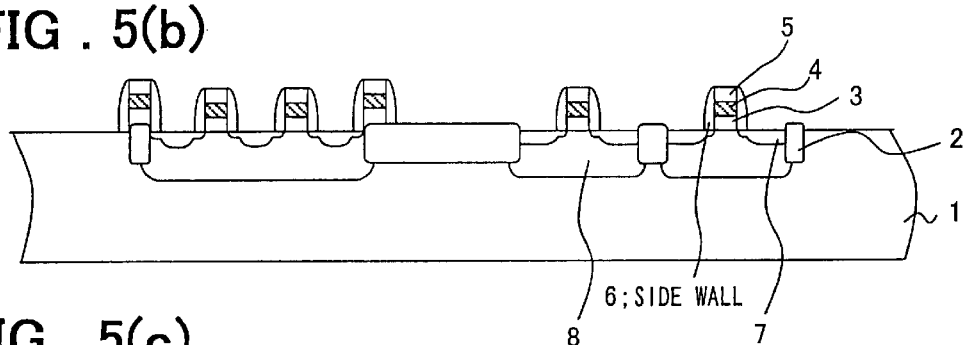

Subsequently, after a silicon oxide film is deposited to cover the gate electrodes as shown in FIG. 5(b), side walls 6 are formed by applying an anisotropic etching and $n^+/p^+$ layers are formed implanting ions of phosphorus and boron, etc. under protection of given regions with a resist pattern.

Figure 5C:
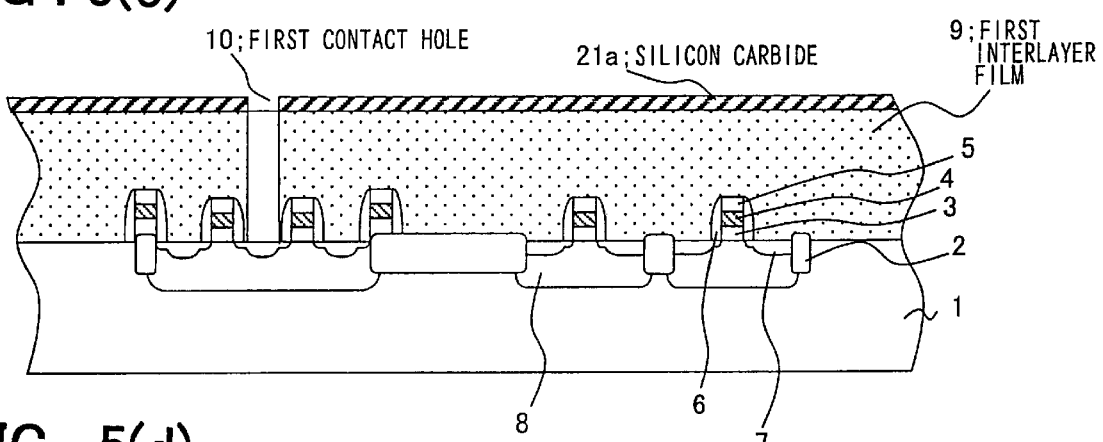

Then, a first interlayer film 9 is deposited over an entire surface of the silicon substrate 1 followed by forming contact holes as shown in FIG. 5(c). In order to conduct etching using SiC 21a as an etching mask, SiC 21a having a thickness of about 200 nm is formed on the first interlayer film 9 by CVD process using, for example, trichlorosilane and propane as a raw material gas.

Subsequently, a resist having a thickness of about 500 nm is applied on SiC 21a and a resist pattern is formed so that a regions which are connected to bit lines are exposed. A portion of SiC 21a exposed in the opening of the resist pattern is removed by plasma etching process using the resist pattern as an etching mask and using, for example, a parallel plate RIE system. Etching is conducted by using $NF_3$/Ar gas as an etching gas at a flow rate of $NF_3$/Ar=30/200 sccm, a pressure of 2.66 Pa (20 mTorr) and a stage temperature of 0° C.

Thereafter, the resist is removed by an ashing treatment (burning or thermal decomposition) using oxygen plasma and wet etching with an acid or alkaline solution. Then, a contact hole 10 is formed by removing the first interlayer film 9 by the plasma etching process using SiC 21a as an etching mask and, for example, a parallel plates RIE system as shown. Etching was conducted using $C_4F_8/CO/Ar/O_2$ gas as an etching gas at a flow rate of $C_4F_8/CO/Ar/O_2$=25/60/300/10 sccm, a pressure of 5.32 Pa (40 m Torr) and a stage temperature 0° C.

Figure 5D:
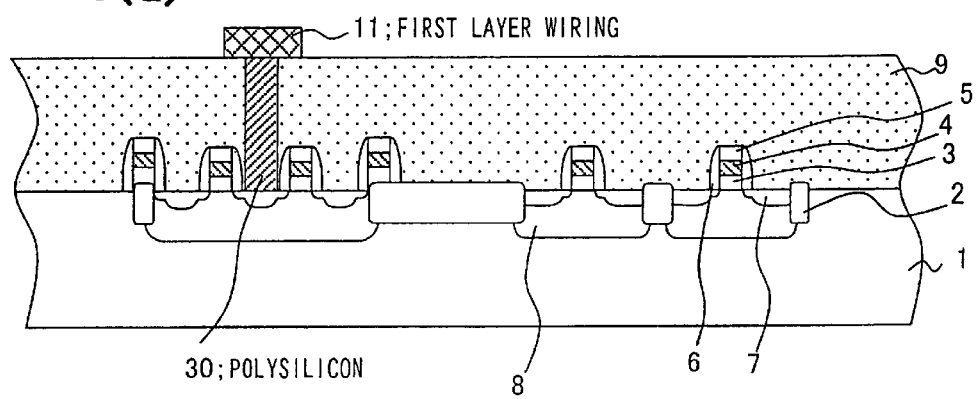

Since SiC 21a which was formed under the conditions of the present embodiment has enough resistivity (1E14 Ωcm), it may be left as it is, or alternatively may be removed by performing an etching by using a parallel plate RIE system at a flow rate of $NF_3$/Ar=500/1000 sccm, a pressure of 39.9 Pa (300 mTorr) and a stage temperature of 0° C. After polysilicon is buried in the first contact hole 10 as shown in FIG. 5(d), a bit line (first layer wiring (11) which will be connected to polysilicon is formed.

SiC 21b having a thickness of about 200 nm is formed over the entire surface of the silicon substrate similarly to the case shown in FIG. 5(c) after silicon oxide film 12 is deposited over the entire surface of the silicon substrate 1 as shown in FIG. 6(e). Subsequently, a resist film having a thickness of about 500 nm is applied on the SiC 21b and a resist pattern is formed in such a manner that regions which are connected to storage nodes are exposed and SiC 21b exposed in the resist pattern is removed by, for example, plasma etching process using the resist pattern as an etching mask.

After removal of the resist film, the silicon oxide film 12, and first interlayer film 9 are removed, using an etching mask of SiC 21b, by plasma etching using, for example, a parallel RIE system for forming contact holes 13. Etching was conducted by using $C_4F_8/CO/Ar/O_2$ gas as an etching gas at a flow rate of $C_4F_8/CO/Ar/O_2$=25/60/300/10 sccm, a pressure of 5.32 Pa (40 mTorr) and a stage temperature of 0° C. for the silicon oxide film 12, and by using $C_4F_8/CO/Ar/O_2$ gas as an etching gas at a flow rate of $C_4F_8/CO/Ar/O_2$=25/60/300/10 sccm, and a pressure of 5.32 Pa (40 mTorr) for the first interlayer film 9.

After polysilicon, etc. is buried in second contact holes 13 as shown in FIG. 6(f), a metal film (second film wiring 14) which will be connected to polysilicon is formed and a high dielectric thin film and metal film are subsequently formed thereon, so that a capacitor 15 comprising a dielectric thin film which is sandwiched between the metal films is formed.

SiC 21c having a thickness of about 200 nm is formed over the entire surface of the silicon substrate 1 similarly to the case shown in FIGS. 5(c) and 6(e) after the second interlayer film 16 is deposited over the entire surface of the silicon substrate 1 as shown in FIG. 6(g). Subsequently, a resist having a thickness of about 500 nm is applied and a resist pattern is formed in such a manner that a region which is connected to source/drain and the capacitor is exposed and exposed SiC 21c in the opening of the resist pattern is removed by, for example, plasma etching process using the resist pattern as an etching mask.

After removal of the resist, the second interlayer film 16, silicon oxide film 12, first interlayer film 9 are removed by plasma etching using, SiC 21c as an etching mask, so that a third contact hole 17 extending through the second interlayer film 16, silicon oxide film 12 and first interlayer film 9, and fourth contact holes 18 extending through the second interlayer film 16 are formed. Etching was conducted by using $C_4F_8/CO/Ar/O_2$ as an etching gas at a flow rate of $C_4F_8/CO/Ar/O_2=25/60/300/10$ sccm, a pressure of 5.32 Pa (40 mTorr) and a stage temperature of 0° C. for the second interlayer film 16, by using $C_4F_8/CO/Ar/O_2$ gas as an etching gas at a flow rate of $C_4F_8/CO/Ar/O_2=25/60/300/10$ sccm, a pressure of 5.32 Pa (40 mTorr) for the silicon oxide film 12 and by using $C_4F_8/CO/Ar/O_2$, a flow rate of $C_4F_8/CO/Ar/O_2=25/60/300/10$ sccm and a pressure of 5.32 Pa (40 mTorr) for the first interlayer film 9.

Figure 7H:
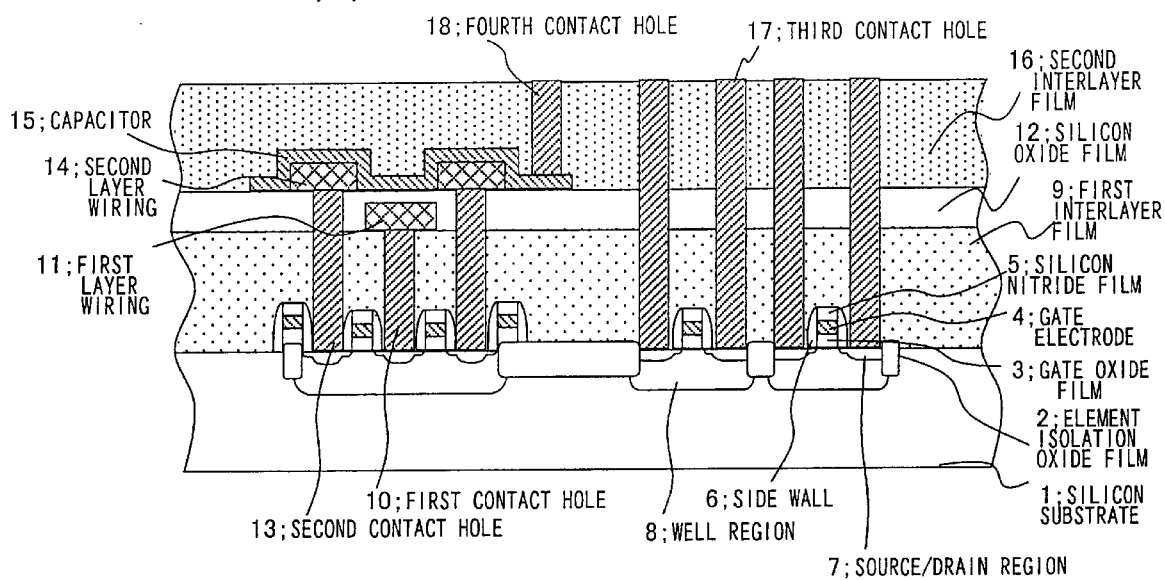
FIG. 7 is a sectional view schematically showing a process for manufacturing a DRAM in accordance with the first embodiment of the invention.
Figure 8:
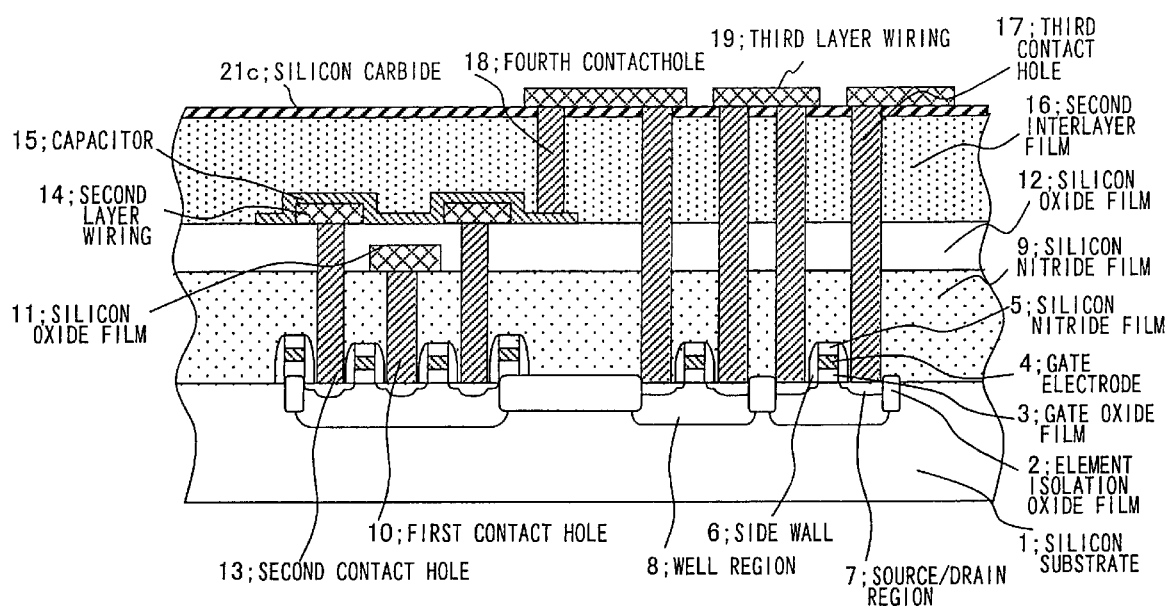
FIG. 8 is a sectional view schematically showing a process for manufacturing a DRAM in accordance with the first embodiment of the invention.

Then, after titanium and titanium nitride are buried in a fourth contact hole 18 which is connected with the capacitor, and titanium nitride is buried in a third contact hole 17 which is connected to the source/drain 7 as shown in FIG. 7(h), titanium silicide is formed in the source/drain region 7 by conducting heat treatment.

Figure 7I:
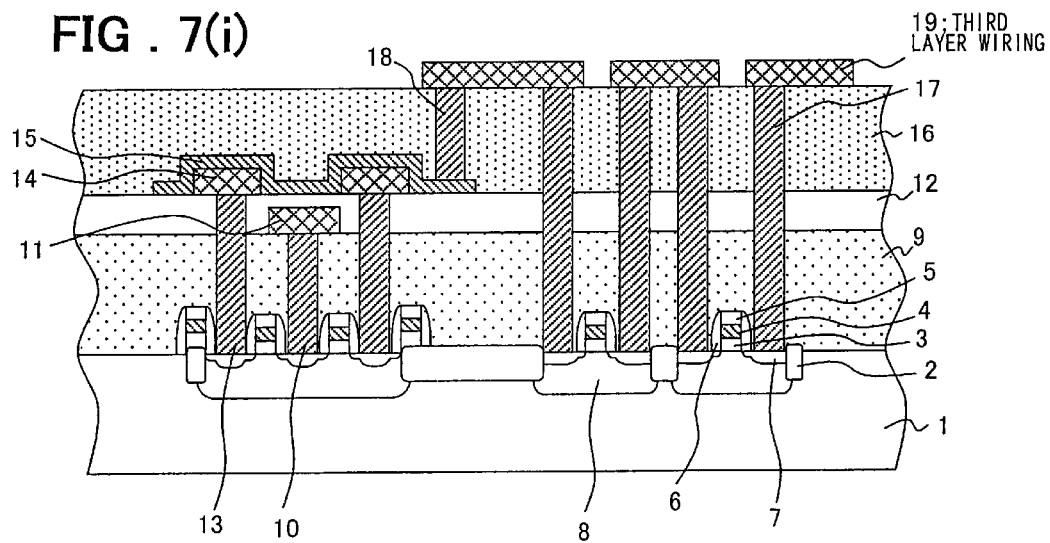

After a third layer wiring 19 is formed by depositing a film of a metal such as Al as shown in FIG. 7(i), a DRAM is formed by depositing an interlayer insulating film and a passivation film (not shown) thereon.

Since SiC 21 is used as an etching mask on formation of the contact hole shown in FIGS. 5(c), 6(e) and 6(g) in accordance with the process for manufacturing the DRAM of the present embodiment, it is possible to sufficiently increase the etching selectivity for the mask of the first interlayer film 9, silicon oxide film 12 and second interlayer film 16 through which the contact hole is formed. Accordingly, an increase in the diameter of the opening (edge) due to etching of the mask can be prevented, so that contact holes having an exact specified size can be provided.

Although an excel lent etching process can not be conducted according to the conventional process since high etching selectivity can not be obtained if the first or second interlayer film 9 or 16 is an organic film in the conventional using the resist pattern as an etching mask, contact holes can be collectively formed by using only SiC 21 since enough etching selectivity can be assured present embodiment, resulting in simplification of the process.

Since SiC 21 which is formed under the conditions of the present embodiment has enough resistivity, it is not necessary to remove the etching mask after the formation of the contact holes as is the case using polysilicon as a mask. Process can be further simplified by leaving SiC 21 as shown in FIG. 8.

Figure 9A:
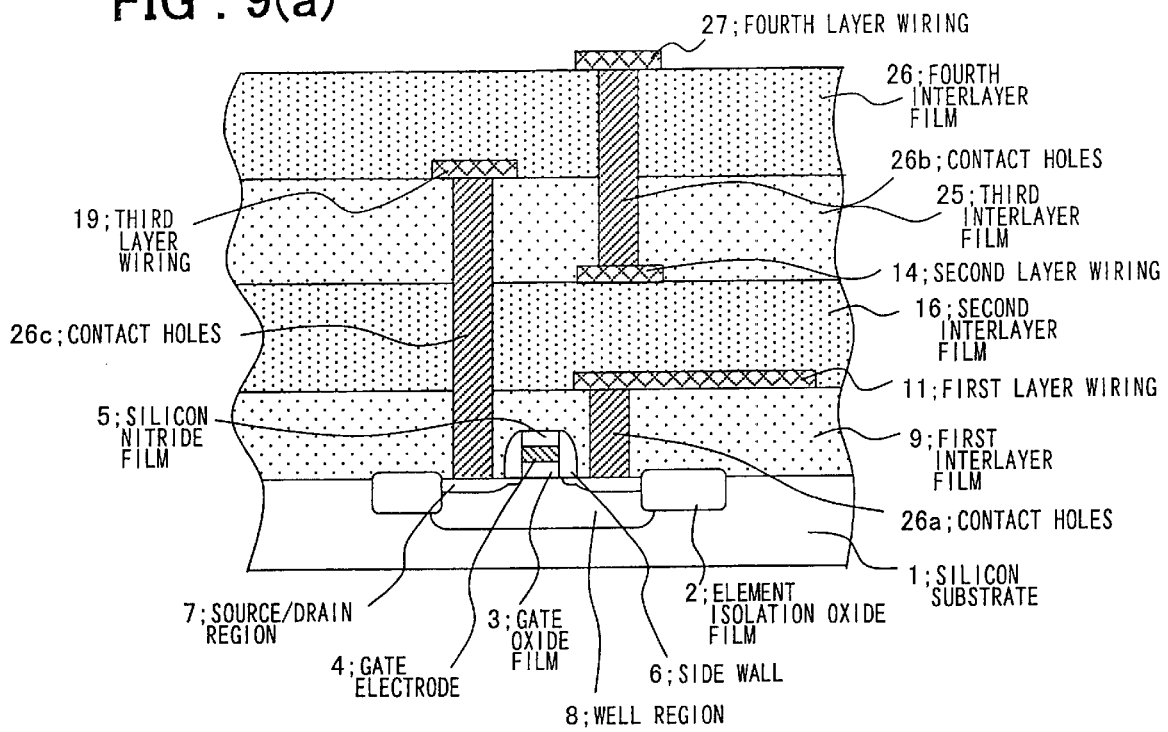
FIG. 9 is a sectional view schematically showing a multilayered wiring structure in accordance with the first embodiment of the invention.
Figure 9B:
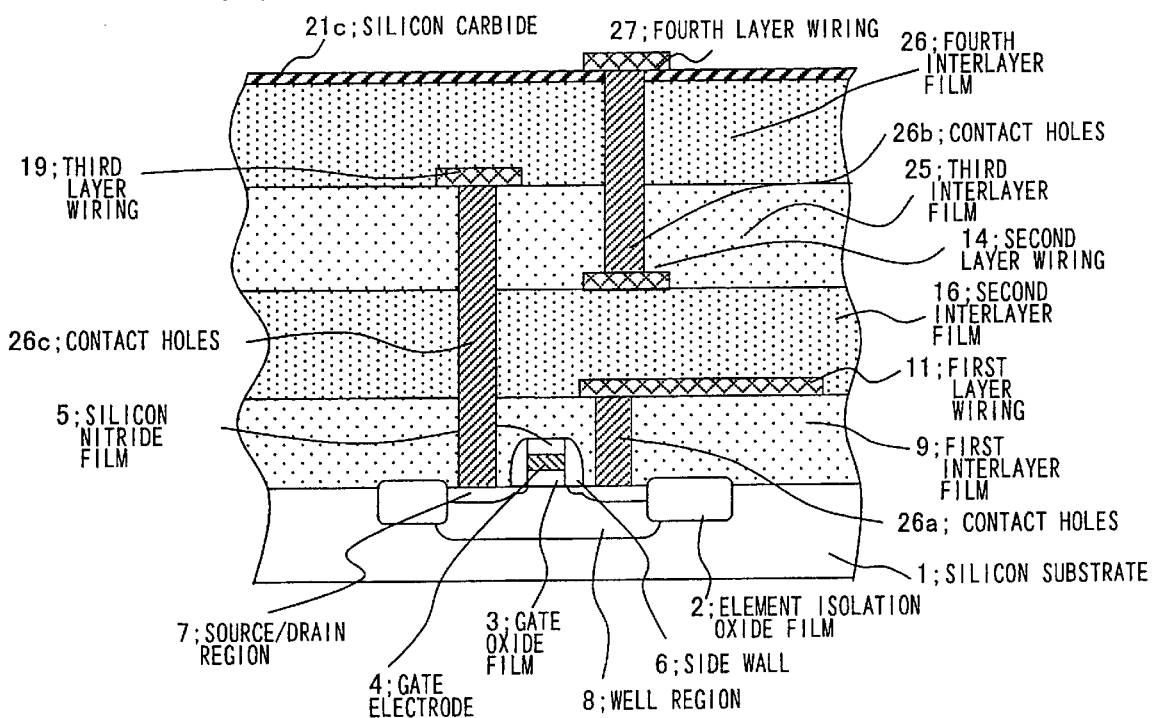
Figure 10A:
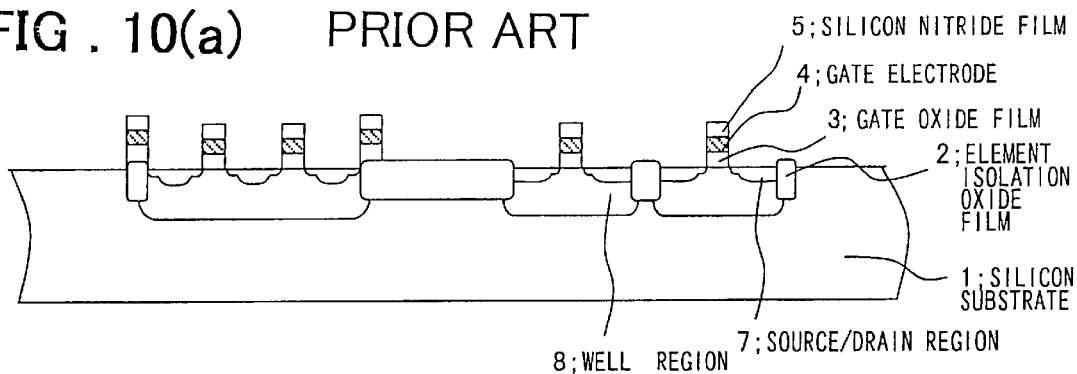
FIG. 10 is a sectionally view showing a conventional process for manufacturing a DRAM.
Figure 10B:
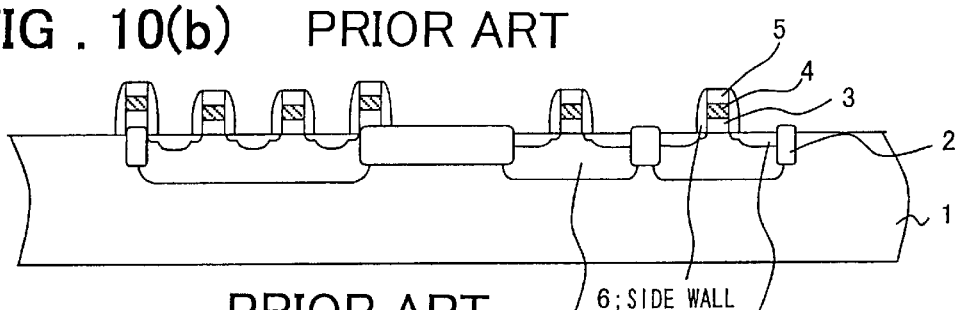
Figure 10C:
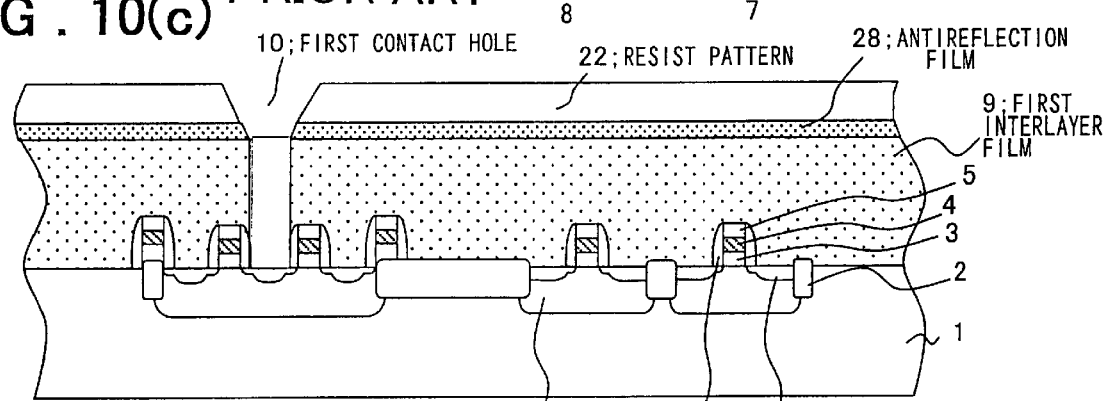
Figure 10D:
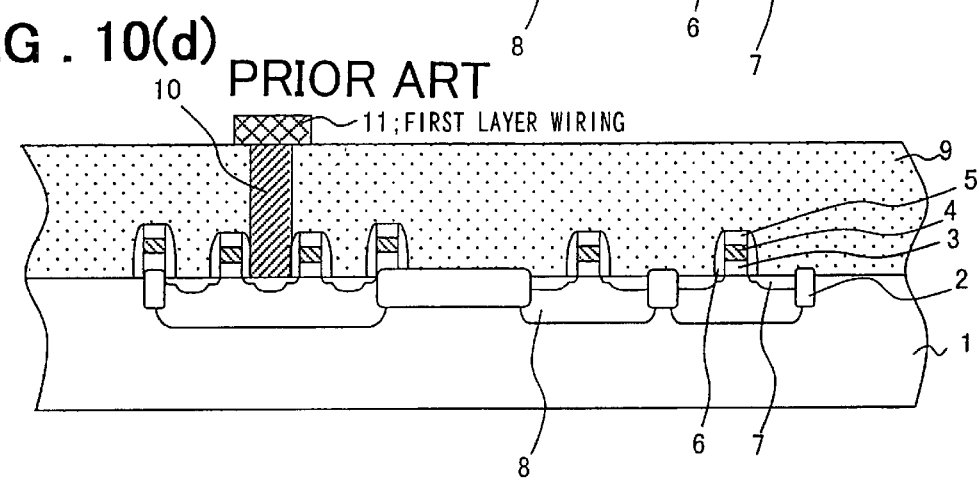
Figure 11E:
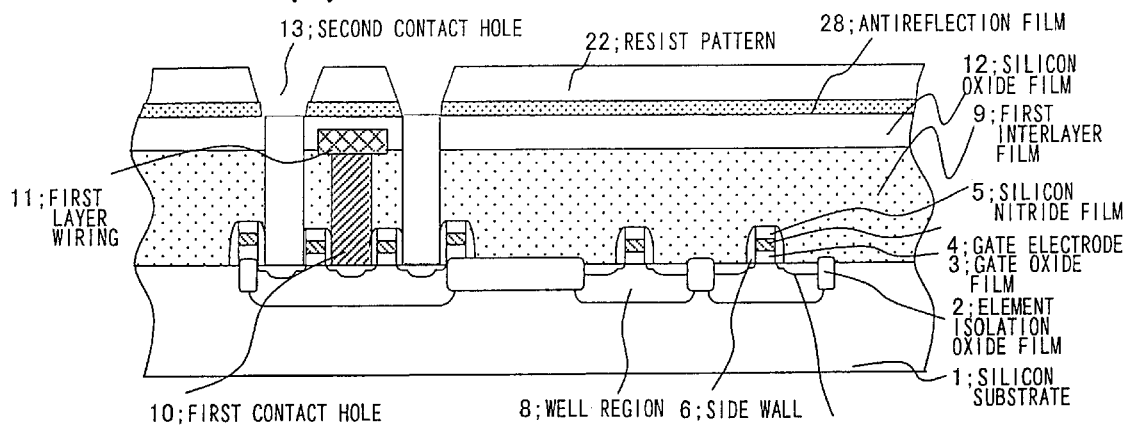
FIG. 11 is a sectional view showing a conventional process for manufacturing a DRAM.
Figure 11F:
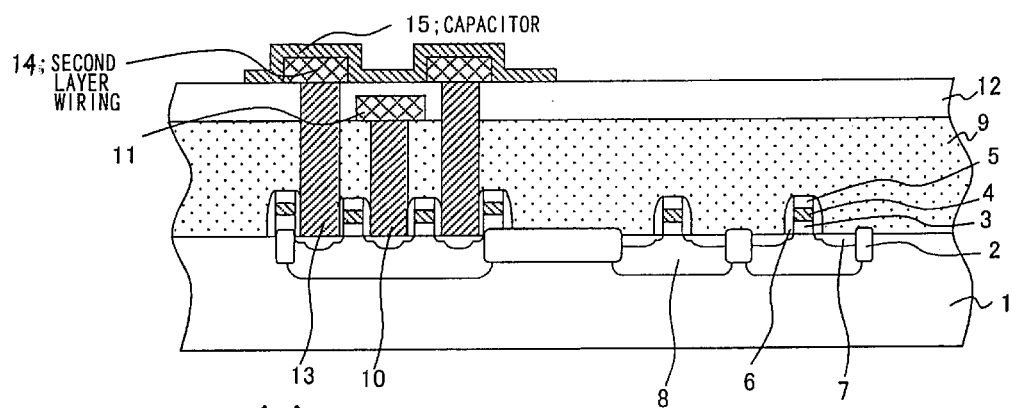
Figure 11G:
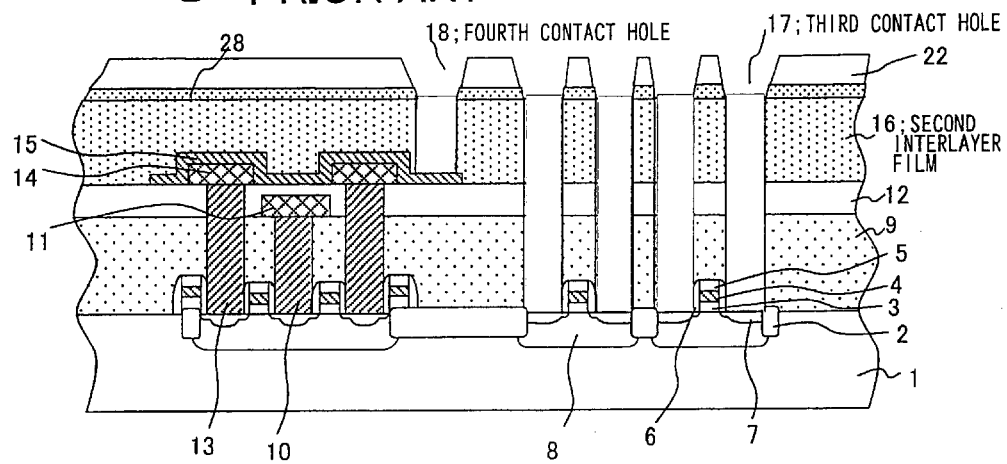
Figure 12H:
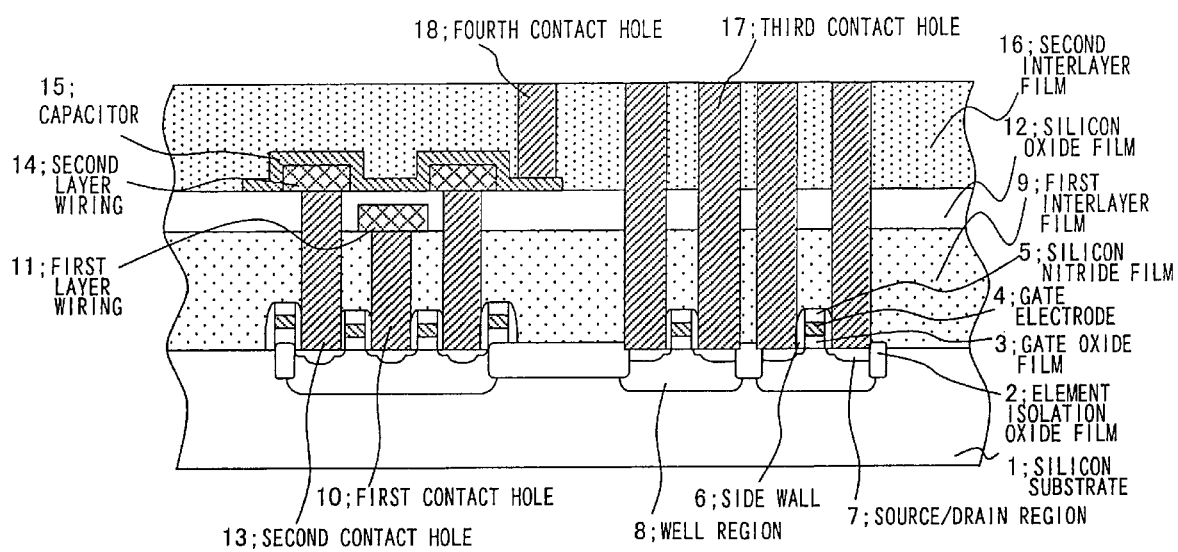
FIG. 12 is a sectional view showing a conventional process for manufacturing a DRAM.
Figure 12I:
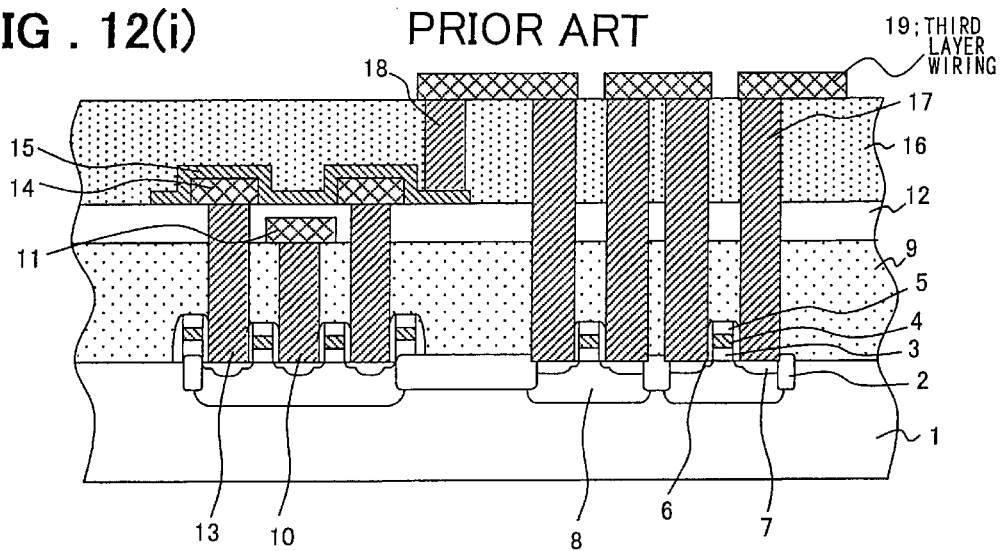
Figure 13A:
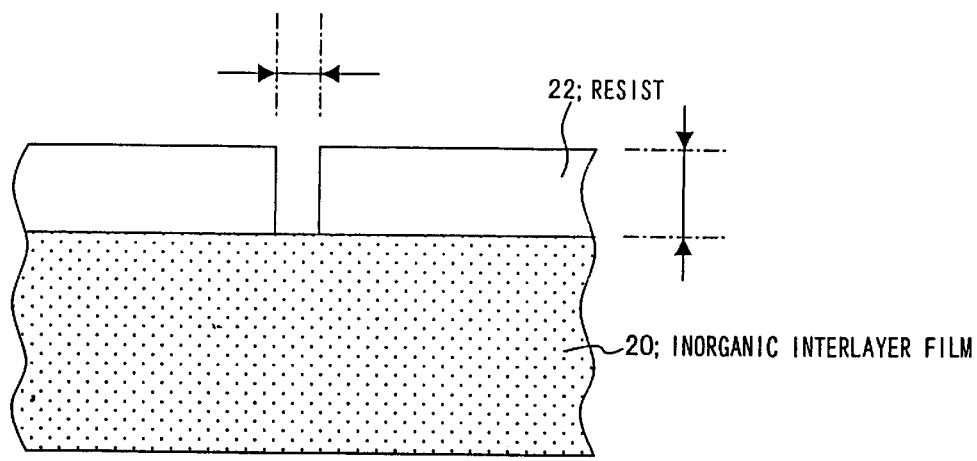
FIG. 13 is a sectional view showing a conventional process for forming contact holes.
Figure 13B:
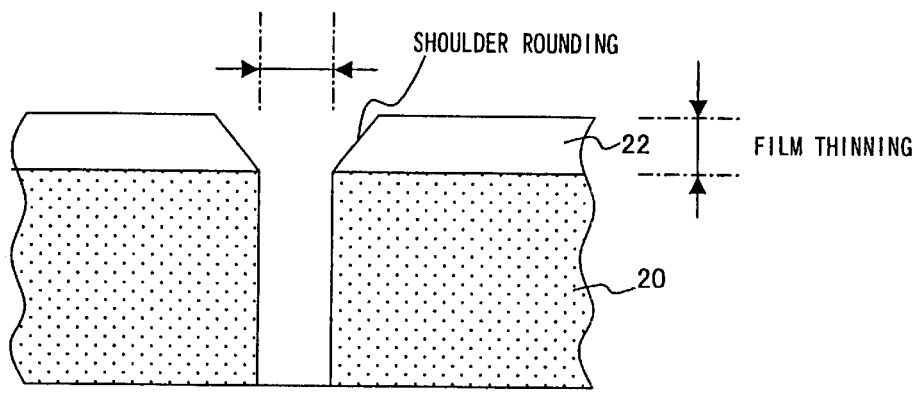
Figure 14A:
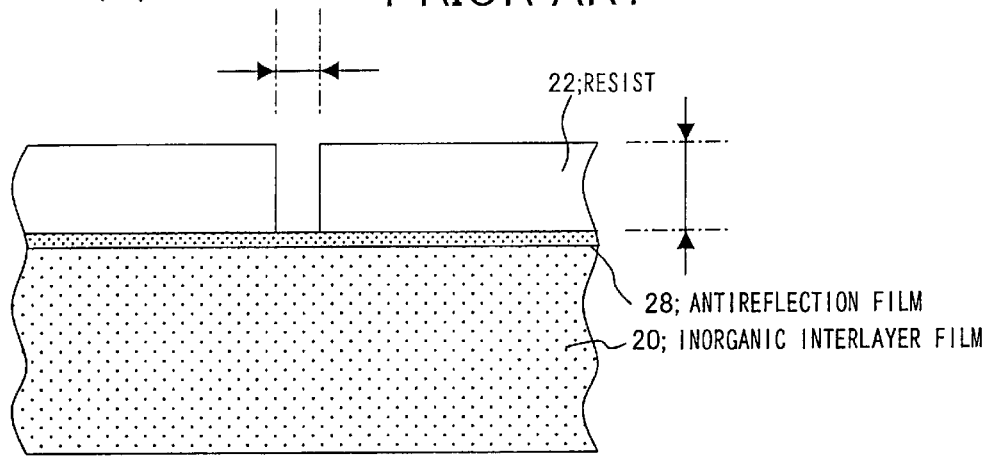
FIG. 14 is a sectional view showing a conventional process for forming contact holes.
Figure 14B:
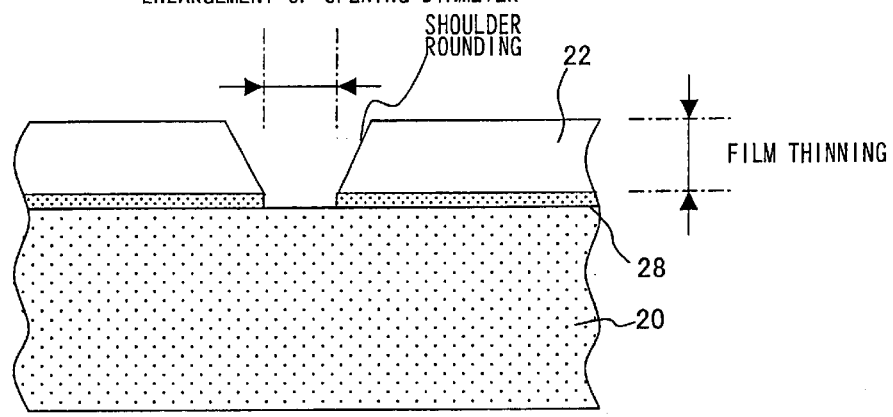
Figure 14C:
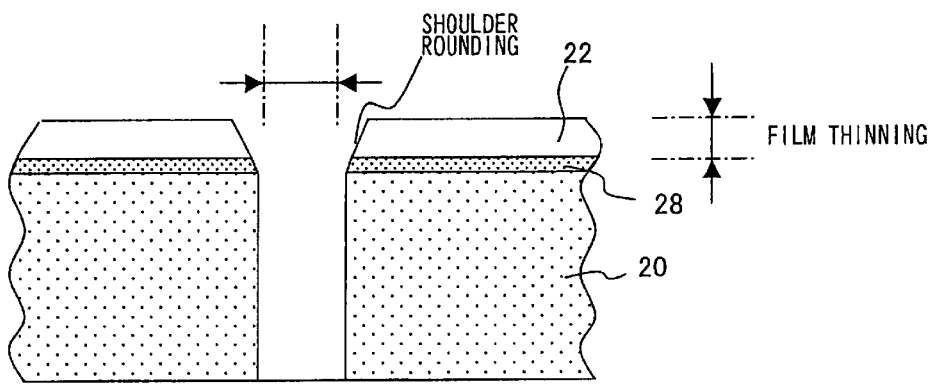
Figure 15:
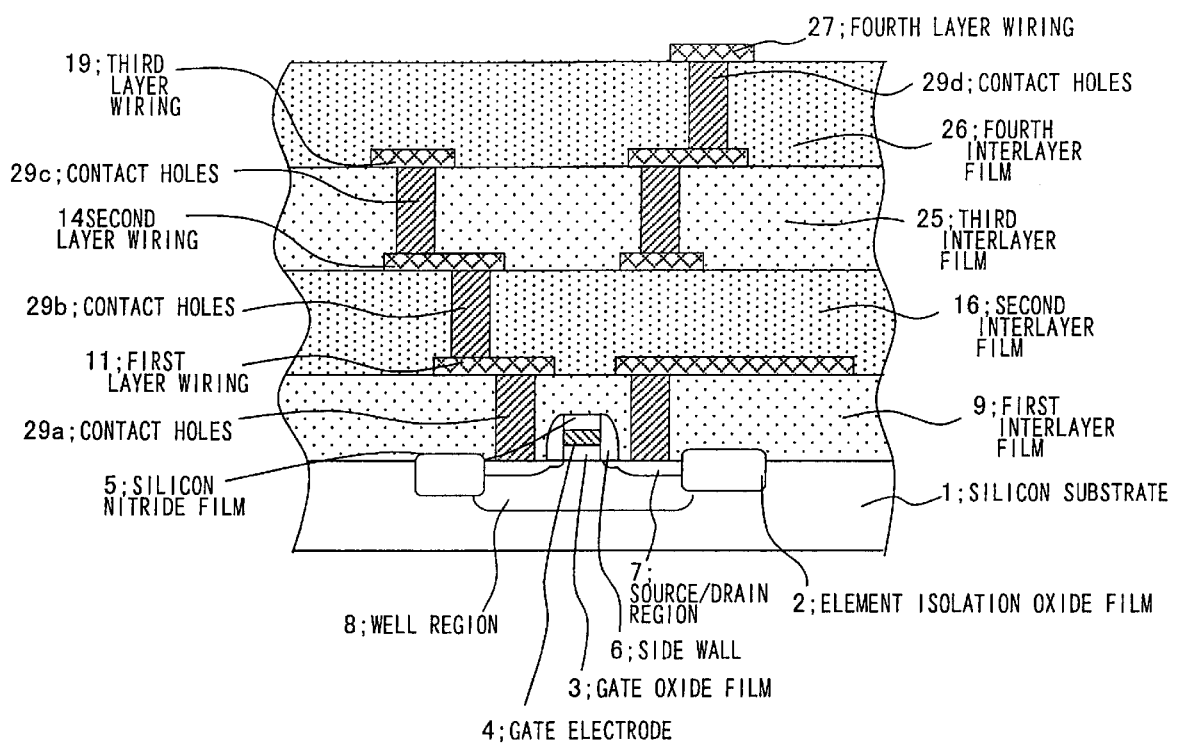
FIG. 15 is a sectional view showing a conventional multilayered wiring structure.

A process for forming a multilayered wiring structure in accordance with a second embodiment of the present invention will be described with reference to FIG. 9. FIG. 9 is a view schematically showing part of a memory array unit of a DRAM having a multilayered structure of the second embodiment of the present invention. FIG. 9(a) shows the structure in which the etching mask is removed and FIG. 9(b) shows the structure in which the etching mask remains.

In the multilayered wiring substrate of the second embodiment, a first interlayer film 9, first layer wiring 11, second interlayer film 16, second layer wiring 14, third interlayer film 25, third layer wiring 19, fourth interlayer film 26 and fourth layer wiring 27 are successively formed on a MOS transistor which is formed on a silicon substrate 1 as shown in FIG. 9. A contact hole 26a extends through the first interlayer film 9 to connect a source/drain region 7 to the first layer wiring 11. A contact hole 26b extends through the third and fourth interlayer films 25 and 26, straightly to connect the second layer wiring 14 to the fourth layer wiring 27. A contact hole 26c extends through the first, second and third interlayer films 9, 16 and 25, respectively to connect the source/drain region 7 to the third layer wiring 19.

If such a multi layered wiring structure is to be formed, the conventional process for forming contact holes by using conventional resist pattern as an etching mask is unable to open holes having high aspect ratio. Accordingly, a contact hole which extends through a single interlayer film is formed after the formation of each interlayer film and polysilicon, etc. is buried therein and a wiring layer is formed thereon. By repeating this steps, wiring layers which are formed through a plurality of interlayer films are connected.

In a case where a contact hole is formed for each interlayer film in such a manner, the contact holes per se should not be overlapped to each other as viewed in a normal direction of the substrate. The process is complicated. However, if the etching mask of the present embodiment is used, SiC 21 has enough etching selectivity for any one of the inorganic insulating film of the silicon oxide film, the silicon nitride film and the organic insulating film of benzocyclobutene, polyimide and the electrically conductive film of Al and polysilicon, contact holes which extend through a plurality of layers can be collectively formed.

Specifically, a contact hole 26c which extends through the first to third interlayer films to reach the source/drain region 7 is formed by using SiC as a mask after the formation of the third interlayer film 25 as shown in FIG. 9. A contact hole 26b which extends through the third and fourth interlayer films 25 and 26 can be formed after the formation of the fourth interlayer film 26. Since SiC 21 has enough resistivity similarly to the above-mentioned first embodiment, it may be left on the interlayer film or may be etched out by using parallel plate ERI system.

Since contact holes can be collectively formed to extend through a structure comprising a stack of an inorganic interlayer film, inorganic interlayer film and electrically conductive film by using SiC 21 as an etching mask with only changed etching conditions in the process for forming contact holes using the etching mask of the present embodiment, reduction in size of the semiconductor device having a multilayered wiring can be achieved. The manufacturing process can be simplified by reducing the number of dry etching steps. Connection between wirings can be made more reliable in comparison with that of the method of forming a wiring layer for each interlayer film.

The meritorious effects of the present invention are summarized as follows.

As mentioned above, a structure comprising a stack of an inorganic insulating film of silicon oxide film, silicon nitride, organic insulating film of benzocyclobutene, polyimide and electrically conductive film of Al, polysilicon, etc. can be collectively formed by using only one etching mask in accordance with the inventive process for forming the etching mask and contact holes by using the same etching mask.

The reason resides in that silicon carbide has enough etching selectivity relative to any of the inorganic insulating films of silicon oxide films, silicon nitride film, organic insulating film of polyimide, etc. and electrically conductive film of polysilicon, etc. since it is used as an etching mask.

The present invention provides an advantage that the process for removing the etching mask which was used for forming contact holes can be eliminated to provide a simplified overall process.

The reason resides in that no problem occurs even if SiC is not removed after the formation of the contact holes since SiC which is used as an etching mask in the present invention has enough insulating properties (volume resistivity: 1E14 Ωcm or more).

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor device comprising:

a semiconductor substrate;

at least one gate electrode and source/drain regions on said substrate;

at least one layer of silicon carbide; and a plurality of interlayer films and a plurality of wiring layers which are stacked on said gate electrode, said gate electrode(s) and said wiring layers being connected to one another through contact holes formed to extend through at least one interlayer film, wherein at least one of said contact holes is self-aligned to an opening in at least one of said silicon carbide layers.

2. A semiconductor device comprising:

a semiconductor substrate;

at least one gate electrode and source/drain regions thereon;

at least one layer of silicon carbide; and a plurality of interlayer films and a plurality of wiring layers which are stacked on said gate electrode, said gate electrode(s) and said wiring layers being connected to one another through contact holes formed to extend through said interlayer films, wherein at least one of said contact holes is formed to extend through a silicon nitride film which is disposed to cover said gate electrode(s) and one of said interlayer films which is deposited on said gate electrode, said at least one contact hole being self-aligned to an opening in one of said silicon carbide layers.

* * * * *